US011476289B2

(12) United States Patent
Adusumilli et al.

(10) Patent No.: US 11,476,289 B2
(45) Date of Patent: Oct. 18, 2022

(54) PHOTODETECTOR WITH BURIED AIRGAP REFLECTORS

(71) Applicant: GLOBALFOUNDRIES U.S. INC., Santa Clara, CA (US)

(72) Inventors: Siva P. Adusumilli, Burlington, VT (US); Vibhor Jain, Williston, VT (US); Alvin J. Joseph, Williston, VT (US); Steven M. Shank, Jericho, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 108 days.

(21) Appl. No.: 16/842,080

(22) Filed: Apr. 7, 2020

(65) Prior Publication Data

US 2021/0313373 A1 Oct. 7, 2021

(51) Int. Cl.
*H01L 27/146* (2006.01)

(52) U.S. Cl.
CPC .... *H01L 27/14629* (2013.01); *H01L 27/1462* (2013.01); *H01L 27/1463* (2013.01); *H01L 27/14685* (2013.01)

(58) Field of Classification Search
CPC ........... H01L 27/14629; H01L 27/1462; H01L 27/1463; H01L 27/14685
See application file for complete search history.

(56) References Cited

U.S. PATENT DOCUMENTS

| | | | |
|---|---|---|---|
| 7,777,250 B2 | 8/2010 | Lochtefeld | |
| 7,790,495 B2 | 9/2010 | Assefa et al. | |
| 7,795,064 B2 | 9/2010 | Pan et al. | |
| 8,625,942 B2 | 1/2014 | Na et al. | |
| 9,028,157 B2 | 5/2015 | Na et al. | |
| 9,064,699 B2 | 6/2015 | Wang et al. | |
| 9,864,138 B2 | 1/2018 | Coolbaugh et al. | |
| 10,157,947 B2 | 12/2018 | Chen et al. | |
| 10,795,082 B1 | 10/2020 | Jacob et al. | |
| 2003/0156325 A1 | 8/2003 | Hoshi | |
| 2004/0033003 A1 | 2/2004 | Liu | |
| 2007/0099315 A1 | 5/2007 | Maa et al. | |
| 2008/0070355 A1 | 3/2008 | Lochtefeld et al. | |
| 2011/0037133 A1 | 2/2011 | Su et al. | |
| 2012/0012960 A1* | 1/2012 | Yang | H01L 27/14685 257/E31.127 |
| 2014/0110805 A1* | 4/2014 | Kautzsch | H01L 31/02327 438/57 |
| 2014/0159183 A1 | 6/2014 | Na | |

(Continued)

FOREIGN PATENT DOCUMENTS

CN 1184498 1/2005

OTHER PUBLICATIONS

M. Selim Unlu et al., "Resonant Cavity enhanced photonic devices", Applied Physics Review, Department of Electrical, Computer and Systems Engineering and center for Photonics Research, Mar. 1995, 1 page.

(Continued)

*Primary Examiner* — Nilufa Rahim
(74) *Attorney, Agent, or Firm* — David Cain; Andrew M. Calderon; Calderon Safran & Cole, P.C.

(57) ABSTRACT

The present disclosure relates to semiconductor structures and, more particularly, to photodetectors with buried airgap mirror reflectors. The structure includes a photodetector and at least one airgap in a substrate under the photodetector.

20 Claims, 5 Drawing Sheets

(56) References Cited

U.S. PATENT DOCUMENTS

| | | | |
|---|---|---|---|
| 2014/0197509 A1* | 7/2014 | Haddad | H01L 31/0232 257/432 |
| 2016/0155884 A1 | 6/2016 | Hon et al. | |
| 2017/0133414 A1* | 5/2017 | Chiang | H01L 27/14689 |
| 2017/0179177 A1* | 6/2017 | Goma | H01L 27/14629 |
| 2018/0204761 A1 | 7/2018 | Feilchenfeld et al. | |
| 2019/0341419 A1* | 11/2019 | Kropelnicki | H01L 27/146 |
| 2020/0350447 A1* | 11/2020 | Jonak-Auer | H01L 31/105 |
| 2021/0280626 A1* | 9/2021 | Getty | H01L 27/14683 |
| 2021/0351221 A1* | 11/2021 | Hung | H01L 27/1462 |

OTHER PUBLICATIONS

D. Knoll et al., "High-Performance BiCMOS Si Photonics Platform", 2015 Bipolar/BiCMOS Circuitry and Technology Meeting, Oct. 26-28, 2015, 1 page.

Jae HYoung Ryu et al., "High performance of InGaN light-emitting diodes by air-gap/GaN distributed Bragg reflectors", Optics Express, Sep. 20, 2012, 1 page.

Huang et al., "Long Wavelength Resonant Cavity Photodetector Based on InP/Air-Gap Bragg Reflectors," IEEE Photonics Technology Letters, vol. 16, No. 1, pp. 245-247, Jan. 2004, 1 page.

Response to Office Action dated Dec. 6, 2021 in related U.S. Appl. No. 17/084,186, 6 pages.

Bian et al., "Towards low-loss monolithic silicon and nitride photonic building blocks in state-of-the-art 300mm CMOS foundry", 2 pages.

Giewont et al., "300-mm Monolithic Silicon Photonics Foundry Technology", IEEE Journal of Selected Topics in Quantum Electronics, vol. 25, No. 5, Sep.-Oct. 2019, 12 pages.

Taillaert et al., "Compact efficient broadband grating coupler for silicon-on-insulator waveguides", Optics Letters, Dec. 1, 2014, vol. 29, No. 23, 3 pages.

Scheerlinck et al., "Efficient, broadband and compact metal grating couplers for silicon-on-insulator waveguides", Optics Express, Jul. 23, 2017, vol. 15, No. 15, 6 pages.

Zaoui et al., "Cost-effective CMOS-compatible grating couplers with backside metal mirror and 69% coupling efficiency", Optics Express, Dec. 10, 2012, vol. 20, No. 26, 6 pages.

Rakowski et al., "45nm CMOS—Silicon Photonics Monolithic Technology (45CLO) for next-generation, low power and high speed optical interconnects", OFC 2020, 3 pages.

Laere et al., "Compact grating couplers between optical fibers and Silicon-on-Insulator photonic wire waveguides with 69% coupling efficiency", Department ofInformation Technology (INTEC), 3 pages.

Zaoui et al., "CMOS-Compatible Polarization Splitting Grating Couplers With a Backside Metal Mirror", IEEE Photonics Technology Letters, vol. 25, No. 14, Jul. 15, 2013, 4 pages.

Selvaraja et al., "Highly efficient grating coupler between optical fiber and silicon photonic circuit", IEEE, 2009, 2 pages.

Specification and drawings in U.S. Appl. No. 17/084,186, filed Oct. 29, 2020, 32 pages.

Notice of Allowance dated Feb. 2, 2022 in related U.S. Appl. No. 17/084,186, 8 pages.

Office Action dated Sep. 29, 2021 in related U.S. Appl. No. 17/084,186, 9 pages.

\* cited by examiner

PHOTODETECTOR WITH BURIED AIRGAP REFLECTORS

FIELD OF THE INVENTION

The present disclosure relates to semiconductor structures and, more particularly, to photodetectors with buried airgap reflectors and methods of manufacture.

BACKGROUND

Photodetectors are devices which precisely convert light into electrical signals, and are used, for example, in many different types of imaging, sensing and communication applications. To this end, photodetectors are generally formed using material, such as Ge, which are excellent light absorbers. However, in use, photodetectors often do not absorb all of the light which impinges on them, and, in many cases, a substantial amount of light will pass completely through a photodetector without being absorbed. This can lead to problems both in terms of accuracy and efficiency for the devices.

To improve light absorption, a reflector can be provided under the photodetector to reflect light back into the photodetector so that the reflected light can be absorbed. For example, metallic mirrors, oxide filled trenches, waveguides, Ge layers and GeSn alloy layers have been provided under photodetectors for this purpose. Although this has been helpful in terms of improved absorption, formation of such reflectors is generally expensive and time-consuming. For example, for a typical Si/Ge photodetector utilizing an underlying Ge layer as a reflector mirror, an approximately 1 μm thick Ge layer is required, the formation of which requires an expensive and time consuming process. In this regard, it can take between 2 to 3 hours for growth of 0.5 μm of a Ge layer. Also, these types of reflective structures are not compatible with all types of photodetectors.

SUMMARY

In an aspect of the disclosure, a structure comprises a photodetector and at least one airgap in a substrate under the photodetector.

In an aspect of the disclosure, a structure comprises: a photodetector; and a airgap located under the photodetector, the airgap comprising a lower spherical reflective surface which is configured to reflect light back to the photodetector.

In an aspect of the disclosure, a method comprise: forming at least one cavity in a substrate and which has a bottom curved surface; plugging the at least one cavity to form at least one airgap with the bottom curved surface; and forming a photodetector above the substrate and over the airgap.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to photodetectors with buried airgap reflectors and methods of manufacture. In embodiments, the airgap reflector can be one or more epitaxially sealed airgaps under a photodetector. Advantageously, the implementation of the present disclosure improves the performance of a photodetector reflecting light from a bottom surface of the sealed airgap back into the photodetector.

In embodiments, the sealed airgap(s) are buried within bulk silicon with either standard resistivity of 0.1 to 100 ohm-cm or high resistivity silicon wafers, e.g., a resistivity >>1 ohm-cm or about 1 Kohm-cm to about 10 Kohm-cm or higher. In embodiments, the sealed airgaps are formed under one or more photodetectors formed above the airgaps, and separated from the airgaps by epitaxial material, such as SiGe. Also, in any of the disclosed implementations, trenches used to form the airgaps can be subjected to an optional annealing process prior to being sealed with an epitaxial material. This annealing process will soften the edges of the trenches, making it possible to provide a seal with a planar profile.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1A:
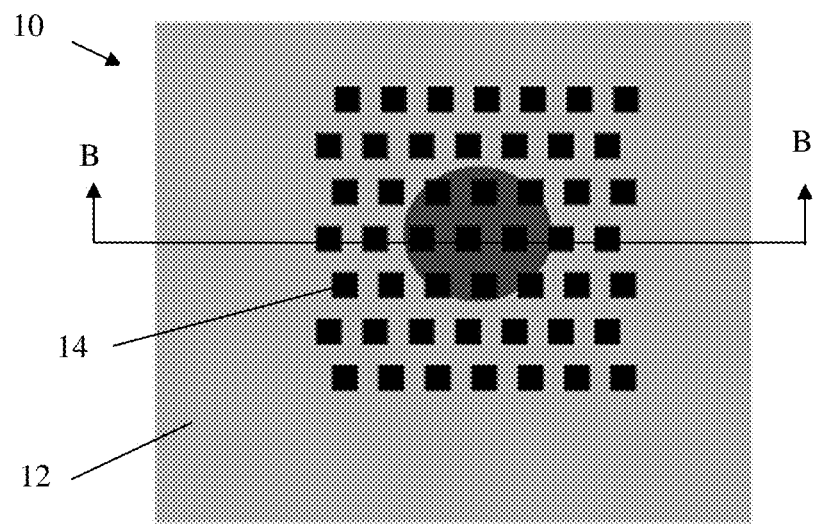
FIGS. 1A-1B show a top view and cross-sectional view, respectively of a trench and cavity in a substrate, amongst other features, and respective fabrication processes in accordance with aspects of the present disclosure.
Figure 1B:
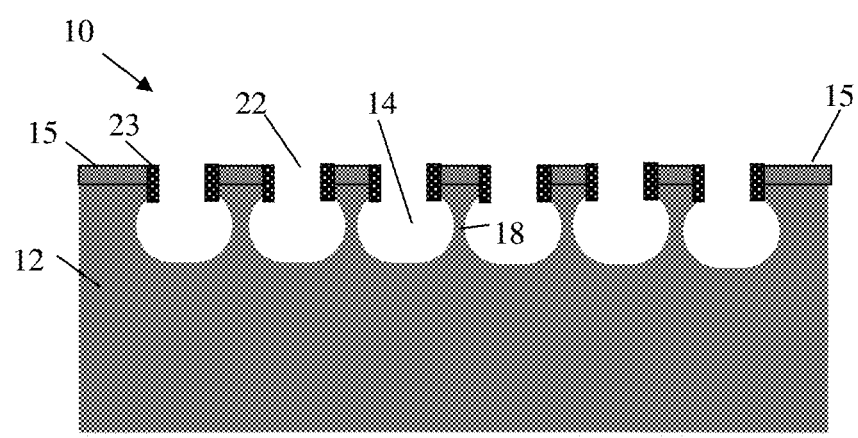

FIGS. 1A and 1B show a trench and cavity formed in a substrate, amongst other features, and respective fabrication processes. FIG. 1A is a top view of the structure 10 and FIG. 1B is a cross-sectional view of the structure 10 taken along a line B-B shown in FIG. 1A. In particular, the structure 10 includes a substrate 12. The substrate 12 can comprise a n+ type semiconductor composed of any suitable semiconductor materials such as, e.g., crystalline silicon, SiGe, SiGeC, SiC, GaAs, InAs, InP, and other III/V or II/VI compound semiconductors. In embodiments, the substrate 12 is composed of high resistivity silicon with resistivity in the range of about between 1 Kohm-cm to 10 Kohm-cm, as an illustrative example.

Still referring to FIGS. 1A and 1B, the substrate 12 includes a plurality of individual cavities 14 that are etched into the substrate 12 using conventional lithography and etching processes. In embodiments, each of the cavities 14 is separated from adjacent cavities by pedestal or wall regions 18. To form the individual cavities 14 in the substrate 12 one or more pad films 15, such as, but not limited to, dielectric materials such as oxide and nitride is deposited on an upper surface of the substrate 12. In embodiments, the nitride can be deposited by a conventional deposition process, e.g., chemical vapor deposition (CVD), to a thickness of about 100 nm to 200 nm; whereas, the oxide can be deposited to a thickness of about to 10 nm. The oxide can be deposited using CVD or other methods known in the art. If the substrate is formed from silicon, then the oxide can be formed in furnace oxidizations of the silicon. It should be understood, though, that other dimensions are also contemplated herein.

Trenches 22 are patterned on the pad dielectric films 15 and into the substrate 12. The trenches 22 can include "holes" and/or "bars." In embodiments, holes would have 1:1 aspect ratio as seen from above, while bars would have aspect ratios >1:1 as seen from above. In more specific embodiments, using conventional lithography processes, a resist formed over the pad dielectric films 15 is exposed to energy (light) to form a pattern (opening). To form the trenches, an etching process with a selective chemistry, e.g., reactive ion etching (RIE), will be used to form one or more trenches 22 through the pad films 15 and extending into the substrate 12. The resist can then be removed by a conventional oxygen ashing process or other known stripants. The width of the trenches 22 is determined by the lithography resolution. In one illustrative example, the pad films are 100 nm thick, the trenches are 120 nm wide, holes and the trenches are 0.7 micron deep into the substrate 12.

Referring to FIG. 1B, a sidewall liner (also referred to as a spacer) 23 is formed on the sidewalls of the trenches 22 by depositing a dielectric material and anisotropically etching the dielectric material from the bottom of the trenches and top planar surface of the substrate 12. In embodiments, the sidewall liner 23 can be an oxide material, as an example, composed of a combination of a thermal oxidization of the silicon substrate 12 in a furnace followed by a chemical vapor deposition (CVD), atomic layer deposition (ALD), or any other known oxide deposition method. In embodiments, the anisotropic etch could consist of a RIE using a perfluorocarbon-based chemistry, as is known in the art, which etches material from planar surfaces but leaves the dielectric material on the sidewall of the trenches 22. In alternative embodiments, the sidewall liner 23 is one or more of any suitable dielectric material such as one or more oxide or nitride layers or combination of dielectric layers deposited using any known deposition method, e.g., CVD, thermal oxidization of the silicon substrate or ALD or any of these combinations.

In any scenario, the sidewall liner 23 should robustly coat the sidewalls of the trenches 22 in order to protect the underlying substrate material from subsequent etching processes (for cavity formation). To achieve this robust sidewall coverage, the dielectric material or materials needs to be thick enough to leave a thick film on the sidewalls of the trenches 22 but not too thick that it pinches off the top opening of the trenches 22, which would prevent cavity formation during a subsequent cavity etch. For example, 40 nm of nitride can be deposited on a 100 nm wide trench. In another embodiment, the sidewall of trenches 22 are thermally oxidized to form a SiO2 layer which extends under the dielectric films 15. Following this thermal oxidization, the sidewall liner 23 can undergo an anisotropic etch. In embodiments, the top surface of pad film 15 is exposed to the spacer etch and is thinned but not fully removed.

As shown in FIG. 1B, the cavities 14 are selectively formed in the substrate 12 by a substrate etching process through the bottom of the trenches 22. In embodiments, the cavities 14 can be about 300 nm in depth below the substrate 12 top surface; although other dimensions are also contemplated herein. In addition, each of the cavities 14 can have a diameter of about 200 nm to about 800 nm as an example; although other dimensions are contemplated herein.

To avoid unintentional etching of the substrate 12 on the sidewall of the trenches and top surface of the structure during formation of the cavities, the pad dielectric material 15 and sidewall liner 23 completely cover the substrate 12. In embodiments, an optional vapor or liquid HF treatment, hydrogen plasma, anneal, basic or acidic chemical clean, or any process known to remove thin or native dielectrics or residual spacer etch polymer from the substrate 12 (e.g., silicon) can be used to remove any excessive dielectric at a bottom of the trenches 22 prior to etching the cavities 14. The post sidewall liner etch cleans (e.g., anisotropic etch) should leave a robust dielectric liner 23 on the top corner and sidewall of the trenches 22 to prevent etching of silicon in substrate 12 through the sidewall of the trenches 22 during the cavity formation. If a thermal oxide formed in a furnace for spacer 23 is used, then silicon under the pad films 15 is oxidized, which may provide a better protective barrier to prevent unintentional substrate 12 etching during the cavities 14 formation. To form the cavities, the exposed substrate material 12 can be removed by a wet etching process or dry etching process. For example, dry etchants can include plasma-based $CF_4$, plasma-based $SF_6$, or gas $XeF_4$ silicon etch, etc., and wet etching processes can include KOH and $NH_4OH$. In embodiments, the cavities 14 can be formed under what will be the photodetector device.

Figure 2:
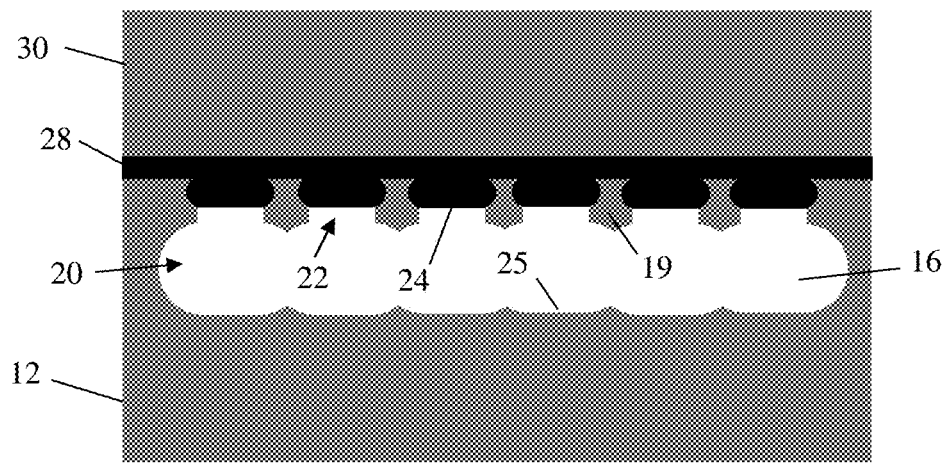
FIG. 2 shows a sealed airgap in the substrate, amongst other features, and respective fabrication processes in accordance with additional aspects of the present disclosure.

Referring to FIG. 2, the individual cavities 14 are further etched to remove the thinner regions of the pedestal portions 18 extending between the individual cavities 14 (leaving the thicker upper portions 19 of each of the pedestal portions 18) to form a single airgap 20 composed of conjoined cavities 16, e.g., a single airgap 20 with a plurality of trenches 22 extending from the substrate. By virtue of the process of first forming individual cavities 14, as shown in FIG. 1B, and then further etching through the thinner portions of the pedestals 18 extending between the individual cavities 14, the resulting airgap 20 has a plurality of curved lower surfaces 25 respectively formed from each of the cavities 14. As will be discussed, for example with reference to FIGS. 3 and 4B, the curved surfaces 25 can be adjusted by the etching processes for focusing light reflected from the curved lower surfaces 25 into a photodetector formed over the combined sealed airgap 20. Also, as will be discussed with regard to FIG. 7, the etching processes for forming the individual cavities 14 and, subsequently, the conjoined single cavity 16 can be controlled to provide an optimal radius of curvature for the curved lower surfaces 25 for focusing reflected light back to a lower surface of the photodetector 38 formed over the combined conjoined cavities 16 (which is used to form the sealed airgap 20).

Still referring to FIG. 2, following the formation of the conjoined cavities 16, the sidewall liner 23 and pad films 15 are removed, exposing the upper surface of the substrate 12 and the sidewalls of the trenches 22 for subsequent processing, as will be discussed. In embodiments, the sidewall liner 23 and pad films 15 can be removed by a conventional etching process selective to such materials. For example, the sidewall liner 23 and pad films 15 can be removed by using a combination of hot phosphorous followed by an HF chemistry or vice-versa depending on the single dielectric layer or a stack of different dielectric layers used for the sidewall liner.

Following the removal of the sidewall liner 23 and pad films 15, the trenches 22 can be subjected to an optional annealing process to soften or round (curve) the edges of the trenches 22. By way of one example, following an HF preclean process, the structure can undergo an annealing process at a temperature range of about 800° C. to about 1100° C., for up to about 60 seconds. In more specific embodiments, the annealing process can be at a temperature of about 650° C. for 60 seconds. In embodiments, the annealing process can be performed in an $H_2$ atmosphere; although other hydrogen atmospheres are also contemplated herein, e.g., $NH_3$, $B_2H_6$, Phi, $AsH_2$ or other gases bonded to hydrogen. In embodiments, the annealing in an $H_2$ or other hydrogen atmosphere may remove any native or other oxide from the silicon substrate surface. This annealing process may smooth or reflow the walls of the trenches 22. If little or no curvature, then the annealing temperature, time, or hydrogen-based gas flow is reduced to eliminate or minimize the silicon substrate reflow.

In embodiments, the critical dimension between the optionally curved silicon at the top of the trenches 22 can be increased by approximately 30% or more during the anneal. In embodiments, though, the annealing process should increase the critical dimension of the curved silicon at the top of the trenches 22 to about 20%. For example, with a trench opening of 120 nm, the critical dimension of the silicon curvature post annealing can increase to about 156 nm, as one non-limiting illustrative example. In this way, the volume at the opening at the top of the trench will be increased, which will effectively allow for more material to be deposited and reflowed therein to completely seal the trench. It should be understood by those of skill in the art that the curvature can be adjusted by temperature and gas flow. For example, the radius of curvature and the critical dimension between the curved silicon at the top of trenches 22 can be increased by increasing the temperature and with adding $H_2$ the required temperature for certain curvatures is reduced. (It should be noted that the rounded top of the trenches 22, as described above, is optional)

Still referring to FIG. 2, a material 28 is deposited on the upper surface of the substrate 12 including, e.g., sidewalls of the trenches 22. In embodiments, the material 28 can be epitaxial SiGe deposited using ultra high vacuum CVD (UHVCVD); although other semiconductor materials, poly or epi films, and deposition processes are also contemplated herein. By way of example, SiGe material 28 can be deposited at a temperature of about 600° C. to 750° C., resulting in a thickness of about 5 nm to about 50 nm. In embodiments, 15 nm of SiGe is deposited at 650° C. and the trench width 22 is 120 nm. It should be understood that other thicknesses of the material 28 can be applied, depending on the critical dimension of the trenches 22. In general, as the width of the trench 22 increases, the thickness of material 28 to fill in the top of the trench 22 during the subsequent reflow anneal increases.

In FIG. 2, following the deposition of the material 28, the wafer is heated to equal to or greater than the reflow temperature of material 28 so that material 28 fills in the top of trench 22 to form SiGe plugs 24. Since SiGe has a lower reflow temperature than silicon, the SiGe material 28 can be reflowed into the opening of the trench 22 to plug or fill the top of the trench 22 without filling in the conjoined cavities 16, thereby forming the sealed airgap 20. In embodiments, the reflow temperature is 800-1050° C. and the reflow time is anywhere up to about 600 seconds. In embodiments, the reflow temperature is 850° C. and the reflow time is 60 seconds.

After the material 28 is reflowed, it forms a marker or etch stop layer 28 over the plugs 24, and semiconductor material 30 is deposited over the etch stop layer 28 (and the remaining surface of the structure) using conventional epitaxial growth processes. In embodiments, the marker or etch stop layer 28 is SiGe material and the semiconductor material 30 can be a Si material. In embodiments, the SiGe layer 28 can be used to completely fill the trenches 22 prior to silicon layer 30 deposition. In embodiments, the semiconductor material 30 can be deposited to a thickness of about 100-150 nm in a deposition chamber having a temperature of about 850° C. to about 1050° C. for about 60 seconds. At this temperature the SiGe material 28 will continue to reflow, continuing to gravitate or migrate into the upper portion of the trenches 22 (e.g., typically at the smallest critical dimension). The semiconductor material 30 may also reflow during the bake, filling in the increased volume at the top of the trench 22. This reflow will also assist in sealing the trenches 22, thereby providing a single sealed airgap 20.

As shown in FIG. 2, the surface of the SiGe material 28 can be flat, although other configurations are also contemplated herein by controlling the SiGe deposition temperature, Ge content, thickness; the reflow temperature, time, and hydrogen or hydrogen-based gas flow; and/or other processes. For example, application of temperature during the reflow process can affect the size and shape of the conjoined cavities 16. In particular, the conjoined cavities 16 can become a different shape, e.g., oval shape, slightly shrinking in volume compared to their original shape.

Thus, the processes described herein can be used for shaping the curved lower surfaces 25 of the conjoined cavities 16, thereby affecting the focusing of light reflected by the curved lower surfaces 25 of the cavities 16 back to a lower surface of an overlying photodetector formed from the semiconductor layer. As such, the curvature of the lower curved surfaces 25 (which is a factor in the focusing of reflected light back to a lower surface of an overlying photodetector 38, as shown in FIG. 4B) can be determined by a combination of the original etching steps for forming the individual cavities 14, further etching steps to remove the pedestals 18, subsequent steps for forming the plug or other thermal steps.

Figure 3:
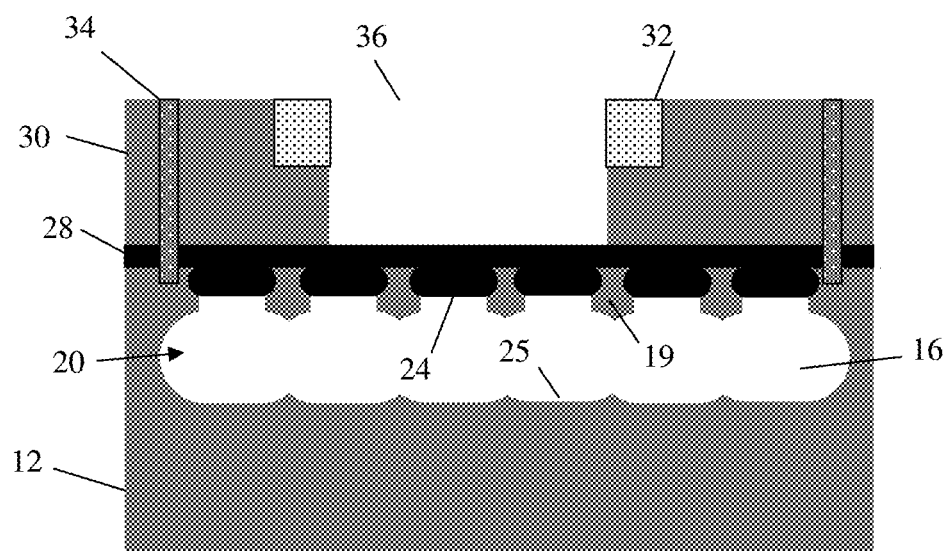
FIG. 3 shows a trench formed above the sealed airgap, amongst other features, and respective fabrication processes in accordance with aspects of the present disclosure.

In FIG. 3, shallow trench isolation (STI) regions 32 are formed in the semiconductor layer 30 for purposes of isolating a photodetector that will subsequently be formed in the semiconductor layer 30. The STI regions 32 are formed using conventional processes for the formation of such isolation regions. Following formation of the STI regions 32, n-type contact regions 34 are formed to extend through the semiconductor layer 30, and the SiGe material 28 and into an upper surface of the substrate 12, utilizing conventional etching and deposition processes. Following this, conventional lithography and etching processes are performed to etch a trench 36 through the semiconductor layer 30, with the etch stop layer (e.g., SiGe material) 28 acting as an etch stop so as to not reopen the sealed airgaps. Accordingly, the etching process is stopped by the SiGe material 28, which also serves to separate a photodetector 38 formed in the trench 36 from the sealed airgap 20.

Figure 4A:
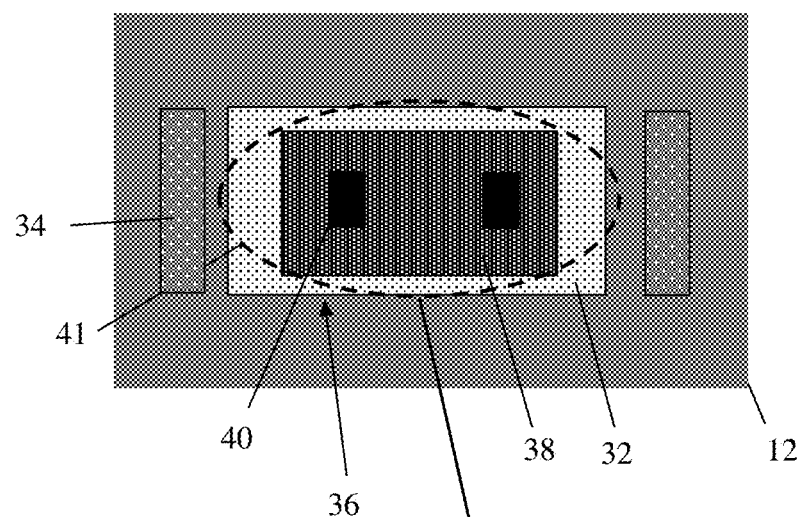
FIG. 4A shows a top view of a photodetector and surrounding structural elements in accordance with aspects of the present disclosure.
Figure 4A:
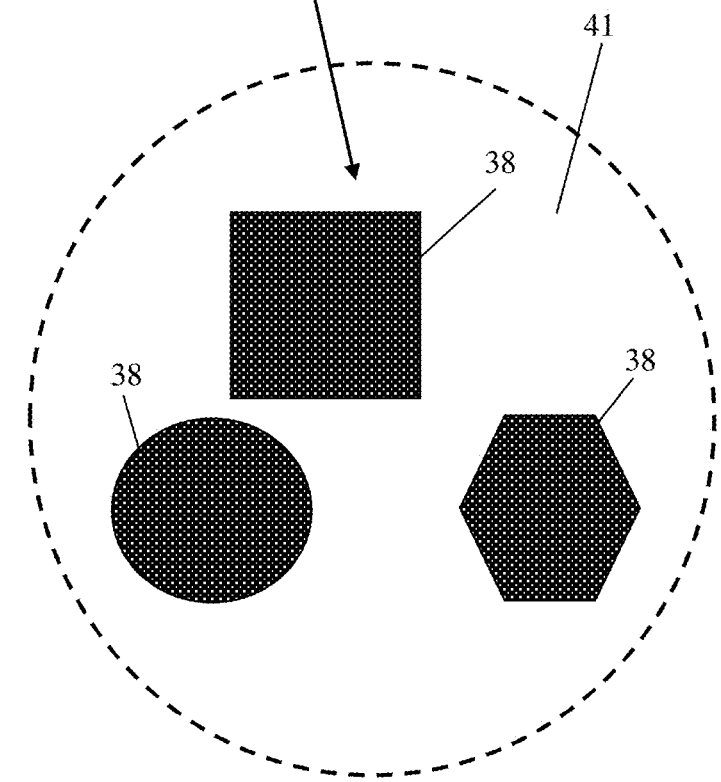
Figure 4B:
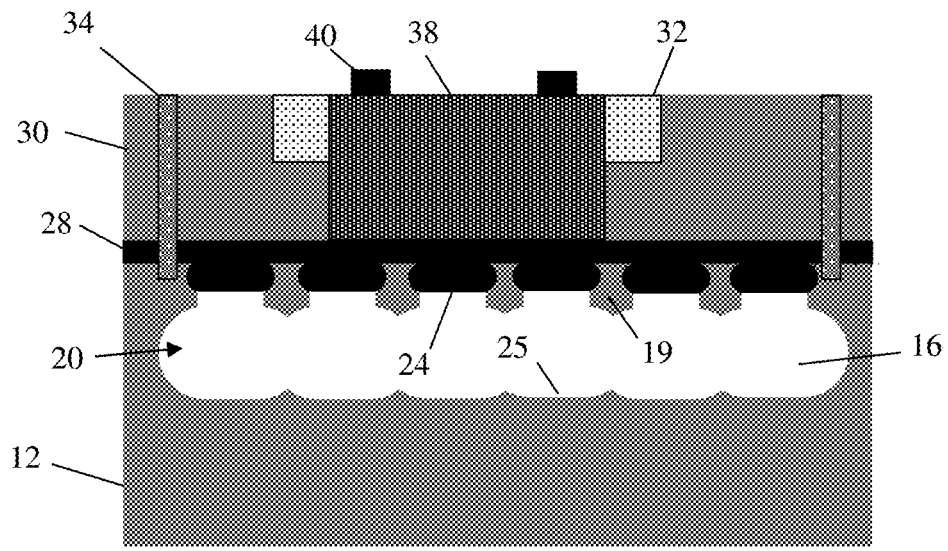
FIG. 4B shows a cross-sectional view of the photodetector and other structural elements shown in FIG. 4A, in accordance with aspects of the present disclosure.

FIG. 4A shows a top view of a photodetector 38 formed in the trench 36, and contacts 40 on an upper surface of the photodetector 38. FIG. 4B shows a cross-sectional view of the structure taken along the sectional line B-B shown in FIG. 4A. In embodiments, the photodetector 38 is a Ge photodetector which is grown by a conventional epitaxial growth process within the trench with the SiGe material 28 as a seed layer. In alternative embodiments, the photodetector 38 can be a Si photodetector which is epitaxially grown in a conventional manner. However, the present disclosure is not limited to use of a particular type of photodetector, and envisions the use of other types of photodetectors formed in the trench 36. For example, the photodetector may be a p-n junction photodiode, a p-i-n photodiode or an avalanche junction photodiode. The photodetector 38 can also be a rectangular configuration; although, as can be appreciated from the inset view 41, the photodetector 38 can have a variety of shapes, including circular, oval, hexagonal, octagonal, square, etc.

The contacts 40 can be p+ contacts formed by conventional lithography, etching and deposition processes. For example, after formation of the photodetector 38, conventional back and of the line (BEOL) processing is used for forming p+ contacts 40 for the photodetector 38. It is noted that although particular conductivity types have been indicated, such as p+ type for the contacts 40, the present disclosure also envisions utilizing opposite conductivity types to those described herein.

It is noted that the spherically shaped air gaps effectively form a scalable airgap 20 under the photodetector 38. In regard to this, the photodetector can be in a range of 1-3 µm in diameter, although other diameters are invention in accordance with the present disclosure. As shown in FIG. 4B, the total diameter of the combined airgap 20 is greater than the diameter or width of the photodetector 38, for example, in a range of 3-5 µm, with each of the conjoined air gaps 16 having an individual diameter between 0.2-0.7 µm, although other dimensions are envisioned in accordance with the present disclosure.

Figure 5:
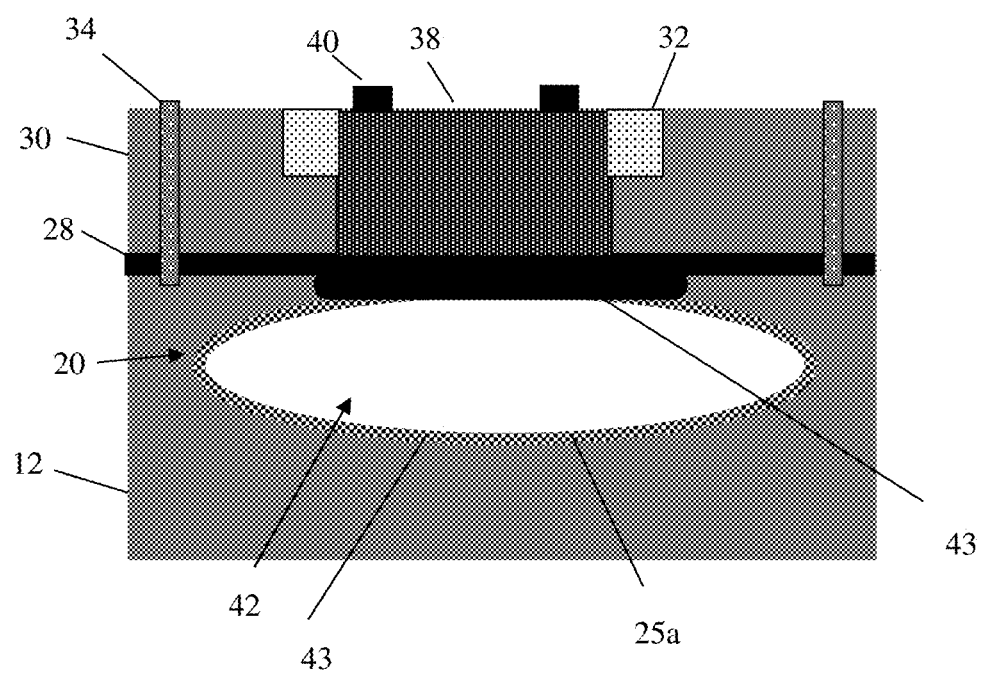
FIG. 5 shows a cross-sectional view of a single sealed airgap under a photodetector, amongst other features, and respective fabrication processes in accordance with the present disclosure.

FIG. 5 shows a cross-sectional view of a structure 10a with a single buried airgap 42 in accordance with aspects of the present disclosure. In the alternative structure 10a, a single sealed airgap 42 is formed utilizing a single trench 43. In embodiments, the diameter of the airgap 42 is between 3 µm-5 µm, although other diameters are envisioned in accordance with the present disclosure. The single buried airgap 42 and the trench 43 can be formed in the same processes described with respect to FIGS. 1A-4B. Also, similar to the curved lower surfaces 25 of the sealed airgap 20, the single airgap 42 has a single curved lower surface 25a with the curvature configured to reflect light which passes through the photodetector 38 back to a lower surface of the photodetector 38.

In FIG. 5, the curved lower surface 25a of the single airgap 42 can be coated with a reflective coating 44 to enhance the reflection capability of the lower surface 25 of the airgap 42. The reflective coating 44 also serves to smooth the lower reflective surface 25 of the airgap 42. The reflective coating 44 can be formed only on the curved lower surface of the airgap 42 or any combination of the curved lower surfaces 25 and sidewalls of the sealed airgap 20 shown in FIGS. 1A-4B. For example, in FIG. 4B, the reflective coating 44 can be provided on the curved side surfaces of the combined sealed airgap 20 and the neck regions 26 of each of the conjoined cavities 16, if desired. Moreover, the reflective coating 44 is deposited on the curved lower surface 25a of the airgap 42, and along the curved sidewalls and into the neck region 26 of the airgap 42. In each of the embodiments, the reflective coating 44 can be formed prior to the formation of the plugs 24 and can be comprised of indium oxide or zinc oxide, deposited using conventional coating processes for such materials.

Figure 6:
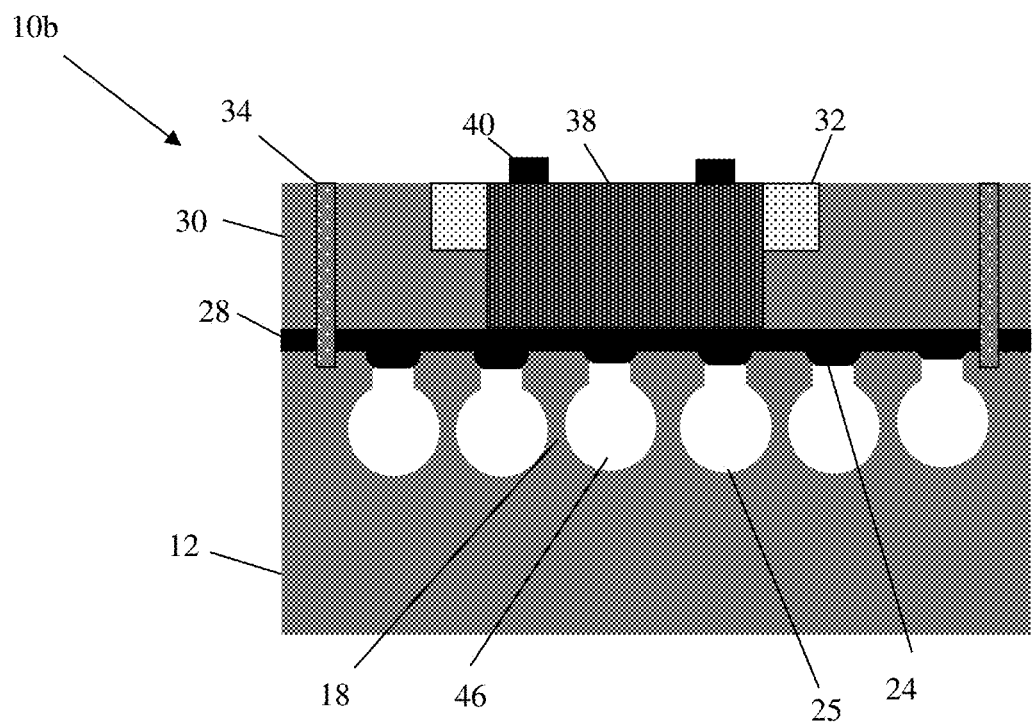
FIG. 6 shows a cross-sectional view of a plurality of individual sealed airgaps formed under a photodetector, amongst other features, and respective fabrication processes in accordance with the present disclosure.

FIG. 6 shows a cross-sectional view of a plurality of a plurality of buried airgaps 42 of an alternative structure 10b. In the alternative structure 10b, the plurality of cavities 14 from FIG. 1B remain separated to form a plurality of non-joined sealed airgaps 46 under the photodetector 38, with each of the individual sealed airgaps 42 being separated from one another by a pedestal or wall 18. The alternative structure 10b utilizes substantially the same processes described above for formation of the structure 10 shown in FIGS. 1A-4B, with the exception of joining the cavities together as shown in FIG. 1B. The individual airgaps 46 are sealed with the SiGe plugs 24 within their respective trenches as discussed above with regard to FIG. 2. In alternative embodiments, either the lower curved surface 25 or the entire surface, including walls 26 of each of the individual airgaps 46 can be coated with a reflective coating 44, as discussed above with regard to FIG. 5.

Figure 7:
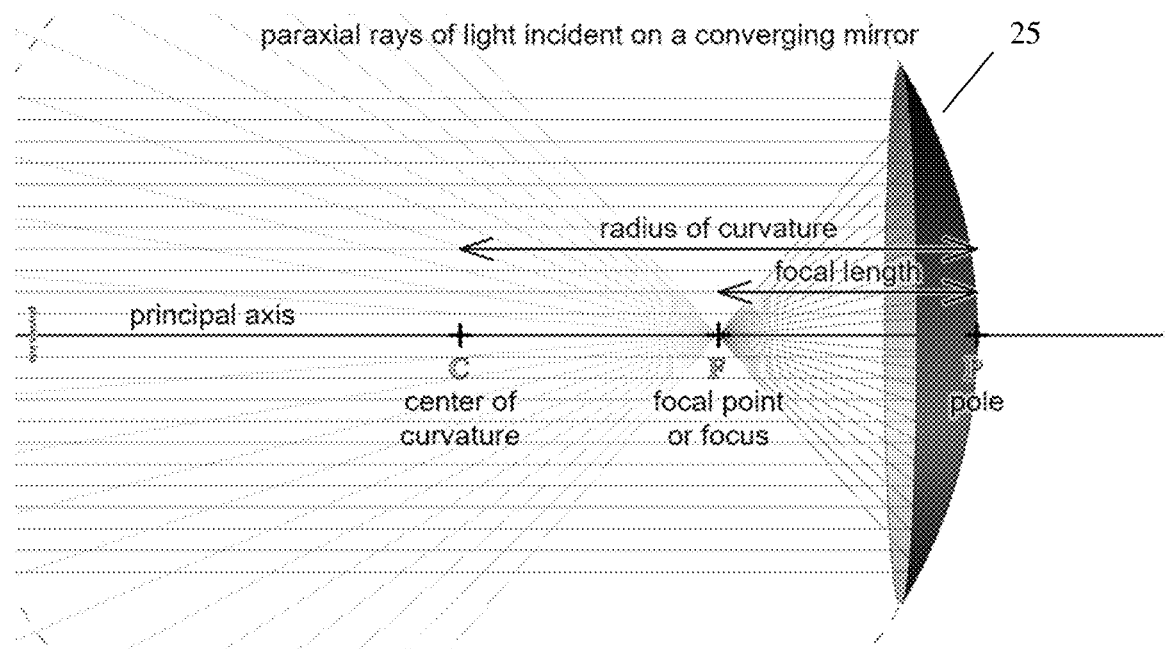
FIG. 7 shows an example of the curved lower surface of the buried airgaps configured to reflect light that is passed through a photodetector back to a lower surface of the photodetector, in accordance with aspects of the present disclosure.

FIG. 7 shows an example of designing the lower surface 25 of any of the above described sealed airgaps 20, 42, 46 for reflecting paraxial rays of light passing through the photodetector 38 back to a lower surface of the photodetector 38, thereby increasing the efficiency of light absorption by the photodetector 38. In particular, as shown in FIG. 7, the lower surfaces 25 of the respective airgaps are configured to have a radius of curvature, relative to a center of curvature C, such that the paraxial rays of light passing through the photodetector 38 will be reflected back from a pole point P of the curved lower surface 25 located along a principle axis of the rays of light to a focal point F based on the focal length of the converging mirror formed by the curved lower surfaces 25. In accordance with aspects of the present disclosure, the lower surfaces 25 are configured so that the focal point F will be located at a lower surface of the photodetector 38. For example, the spherical radius of curvature around the center of curvature C can be 500 nm, with a focal length of 250 nm for the focal point F. In other words, in this example, the distance between the pole point P for the curved lower surface 25 to the bottom surface of the photodetector 38 is 250 nm. Of course, other spacings are envisioned in accordance with the present disclosure.

In accordance with the above, in order to achieve matching of the focal length of the curved lower surface 25 of the various airgaps to the distance to the lower surface of the photodetector 38, it is possible to adjust the overall height of the airgaps. Also, the height of the SiGe plugs 24 will be a factor in determining the spacing between the pole points P of the curved lower surfaces 25 of the airgaps and the bottom surface of the photodetector 38. In the embodiment of FIG. 6, in addition, it is noted that the SiGe material used in the plugs 24 also have some reflective characteristics, and, as such, assist in reflection of the light which passes through the photodetector 38 in the direction of the underlying airgaps.

Accordingly, as should now be understood by those of skill in the art, and as shown in the figures or combinations of these figures the buried reflective airgap(s), formed under a photodetector can be: (i) a plurality of conjoined individual airgaps forming a single sealed airgap, with each conjoined airgap having an individually curved reflective lower surface; (ii) a single large having a single curved reflective lower surface; or (iii) a plurality of individual airgaps, separated from one another, and each having a curved reflective lower surface. In these different schemes, the reflective mirrors effectively operate as a Distributed Bragg Reflector (DBR) for light which passes through a photodetector 38 vertically stacked over the one or more airgaps.

The photodetector with buried airgap mirror reflectors can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a photodetector; and
    at least one airgap in a substrate under the photodetector, wherein the at least one airgap comprises a plurality of separated sealed airgaps, and
    each of the plurality of separated sealed airgaps is fully separated from remaining separated sealed airgaps of the plurality of separated sealed airgaps by a wall region.

2. The structure of claim 1, wherein the at least one airgap includes a curved surface which reflects light which passes through the photodetector back to a lower surface of the photodetector.

3. The structure of claim 2, wherein the at least one airgap is plugged with a plurality of plugs within respective trenches that extend from a surface of the substrate, under the photodetector, to the at least one airgap.

4. The structure of claim 2, wherein the at least one airgap is plugged with a single plug within a trench that extends from a surface of the substrate, under the photodetector, to the at least one air gap.

5. The structure of claim 2, wherein the curved surface is coated with a reflective coating.

6. The structure of claim 2, wherein the at least one airgap is sealed with a SiGe plug, and an entire surface of the plurality of separated sealed airgaps is coated with a reflective coating.

7. The structure of claim 1, wherein the at least one airgap includes a plurality of curved surface which reflect light which passes through the photodetector back to a lower surface of the photodetector.

8. The structure of claim 7, wherein the at least one airgap is plugged with a plurality of plugs within respective trenches that extend from a surface of the substrate, under the photodetector, to the at least one airgap.

9. The structure of claim 1, wherein each of the plurality of separated sealed airgaps comprises a spherical lower surface with a spherical radius and focal point configured to reflect light which passes through the photodetector back to a lower surface of the photodetector.

10. The structure of claim 1, further comprising a layer located between an upper portion of the substrate where the photodetector is located and a lower portion of the substrate where the at least one airgap is located, and an n-type contact region extends through the layer and into the upper portion of the substrate.

11. The structure of claim 1, wherein a width of the at least one airgap is greater than a width or diameter of the photodetector.

12. The structure of claim 1, wherein the photodetector is comprised of Ge material.

13. A structure comprising:
    a photodetector; and
    an airgap located under the photodetector, the airgap comprising a lower spherical reflective surface which is configured to reflect light back to the photodetector,
    wherein the airgap is plugged with an epitaxial semiconductor material comprising SiGe, and the photodetector is above the epitaxial semiconductor material.

14. The structure of claim 13, wherein the airgap comprises a plurality of separated sealed airgaps, and each of the plurality of separated sealed airgaps is fully separated from remaining separated sealed airgaps of the airgap by a wall region, an n-type contact region extends through the epitaxial semiconductor material and into an upper portion of a substrate under the photodetector, and the epitaxial semiconductor material is located between the upper portion of the substrate where the photodetector is located and a lower portion of the substrate where the airgap is located.

15. The structure of claim 14, wherein each of the plurality of separated sealed airgaps comprises the lower spherical reflective surface configured to reflect light back to the photodetector, and an entire surface of the plurality of separated sealed airgaps is coated with a reflective coating.

16. The structure of claim 14, wherein each of the plurality of separated sealed airgaps includes the lower spherical reflective surface and is plugged with the epitaxial semiconductor material comprising SiGe.

17. The structure of claim 13, further comprising shallow trench isolation (STI) regions on sides of the photodetector and above the epitaxial semiconductor material.

18. The structure of claim 13, wherein the lower spherical reflective surface is coated with a reflective material.

19. The structure of claim 18, wherein the reflective material is indium oxide or zinc oxide.

20. A method comprising:
- forming at least one cavity in a substrate and which has a bottom curved surface;
- plugging the at least one cavity to form at least one airgap with the bottom curved surface; and
- forming a photodetector above the substrate and over the at least one airgap,
- wherein the at least one airgap comprises a plurality of separated sealed airgaps, and
- each of the plurality of separated sealed airgaps is fully separated from remaining separated sealed airgaps of the plurality of separated sealed airgaps by a wall region.

\* \* \* \* \*